United States Patent
Gubenko et al.

(10) Patent No.: US 9,036,968 B2
(45) Date of Patent: May 19, 2015

(54) ADIABATIC MODE-PROFILE CONVERSION BY SELECTIVE OXIDATION FOR PHOTONIC INTEGRATED CIRCUIT

(75) Inventors: Alexey Gubenko, Dortmund (DE); Igor Krestnikov, Dortmund (DE); Sergey Mikhrin, Dortmund (DE); Daniil Livshits, Dortmund (DE); Greg Wojcik, Santa Clara, CA (US); Alexey Kovsh, Munich (DE)

(73) Assignee: INNOLUME GMBH, Dortmund (DE)

( * ) Notice: Subject to any disclaimer, the term of this patent is extended or adjusted under 35 U.S.C. 154(b) by 108 days.

(21) Appl. No.: 13/548,553

(22) Filed: Jul. 13, 2012

(65) Prior Publication Data

US 2013/0016942 A1    Jan. 17, 2013

Related U.S. Application Data

(60) Provisional application No. 61/507,233, filed on Jul. 13, 2011.

(51) Int. Cl.
| | |
|---|---|
| *G02B 6/42* | (2006.01) |
| *G02B 6/136* | (2006.01) |
| *G02B 6/122* | (2006.01) |
| *H01S 5/10* | (2006.01) |
| *G02B 6/12* | (2006.01) |
| *H01S 5/22* | (2006.01) |

(52) U.S. Cl.
CPC ............. *G02B 6/136* (2013.01); *G02B 6/1228* (2013.01); *G02B 2006/12078* (2013.01); *G02B 2006/12097* (2013.01); *H01S 5/1064* (2013.01); *H01S 5/2215* (2013.01)

(58) Field of Classification Search
None
See application file for complete search history.

(56) References Cited

U.S. PATENT DOCUMENTS

| | | | |
|---|---|---|---|
| 4,820,655 A | 4/1989 | Noda et al. | |
| 5,078,516 A | 1/1992 | Kapon et al. | |
| 5,543,353 A | 8/1996 | Suzuki et al. | |
| 5,859,866 A | 1/1999 | Forrest et al. | |
| 6,281,523 B1 | 8/2001 | Iwai et al. | |
| 6,282,345 B1 | 8/2001 | Schimpe | |
| 6,819,814 B2 | 11/2004 | Forrest et al. | |
| 6,891,202 B2 * | 5/2005 | Kish et al. | 257/96 |
| 6,989,286 B2 | 1/2006 | Hamilton et al. | |
| 7,060,516 B2 | 6/2006 | Glew et al. | |
| 7,282,311 B2 | 10/2007 | Little et al. | |
| 8,126,301 B2 * | 2/2012 | Ishizaka | 385/31 |
| 8,472,766 B2 * | 6/2013 | Spector et al. | 385/43 |

OTHER PUBLICATIONS

Suematsu et al., "Integrated twin-guide AlGaAs laser with multiheterostructure", IEEE Journal of Quantum Electronics, vol. 11, pp. 457-460, 1975.
Marsh, "Quantum well intermixing", Semiconductor Science Technology, vol. 8, pp. 1136-1155, 1993.
Fang et al., "Electrically pumped hybrid AlGaInAs-silicon evanescent laser", Optical Express, vol. 14, 9203-9210, 2006.
International Search Report and Written Opinion for PCT/US2012/046612, dated Oct. 25, 2012, 10 pages.

* cited by examiner

*Primary Examiner* — Sung Pak
(74) *Attorney, Agent, or Firm* — Brown & Michaels, PC

(57) ABSTRACT

Waveguide designs and fabrication methods provide adiabatic waveguide eigen mode conversion and can be applied to monolithic vertical integration of active and passive elements in PICs. An advantage of the designs and methods is a simple fabrication procedure with only a single etching step in combination with subsequent well-controllable selective oxidation. As a result, improved manufacturability and reliability can be achieved.

21 Claims, 7 Drawing Sheets

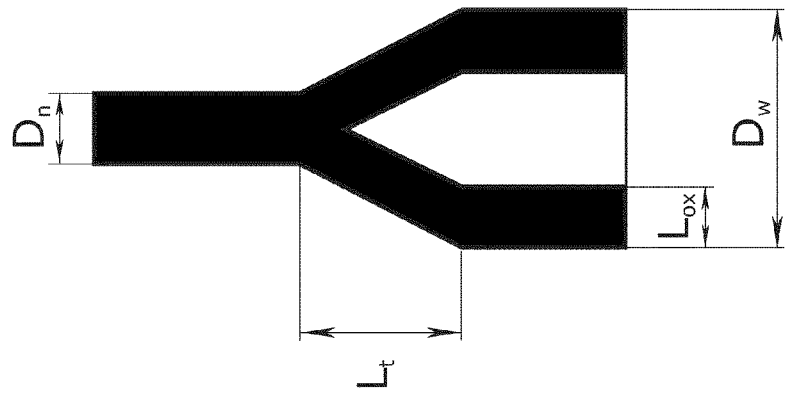
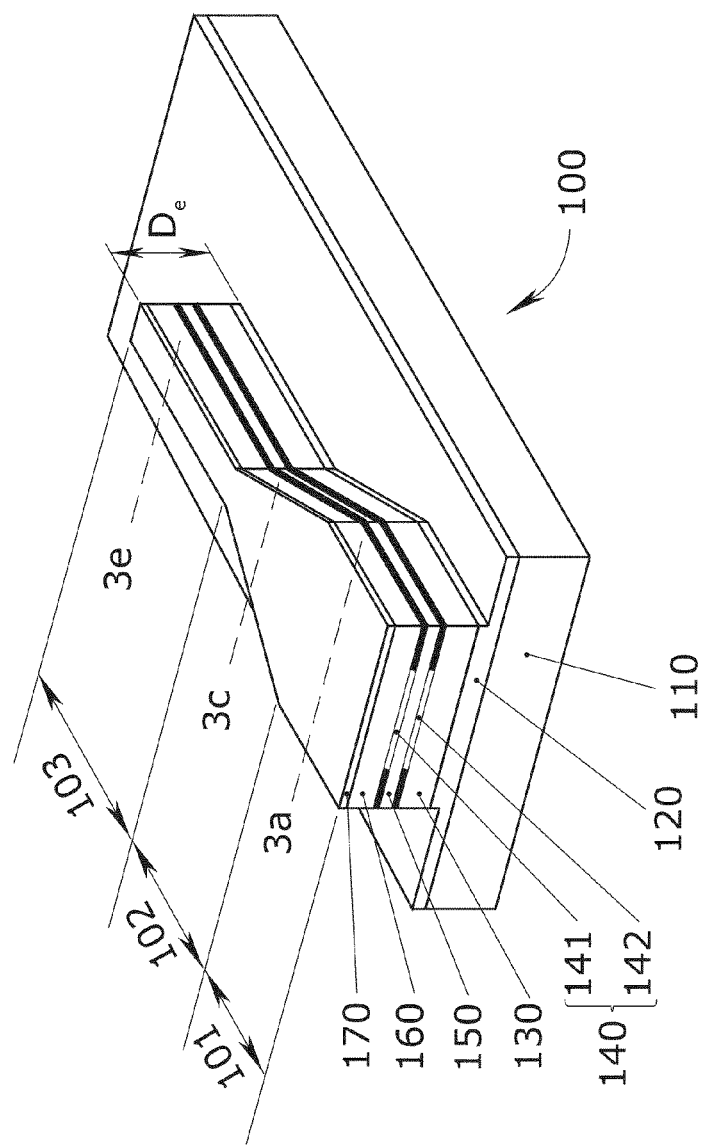
Fig. 2a
Fig. 2b

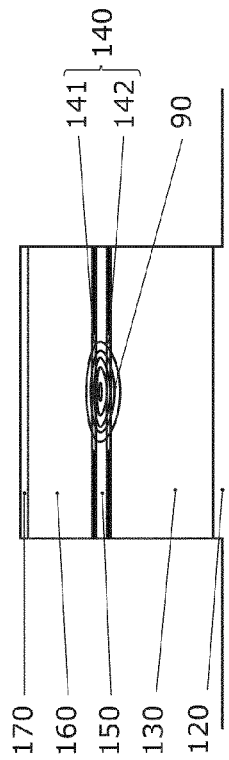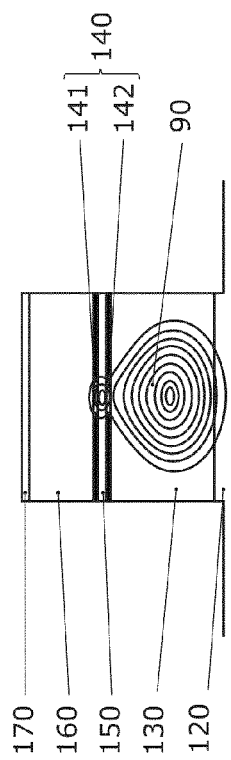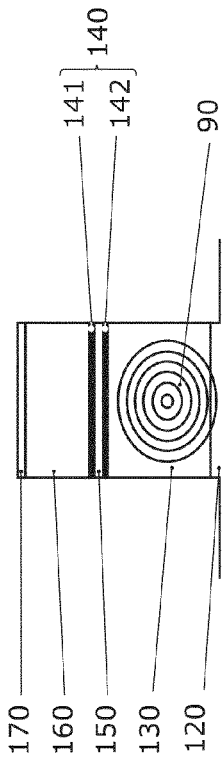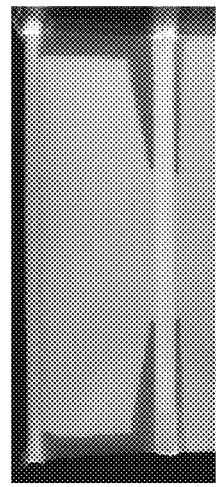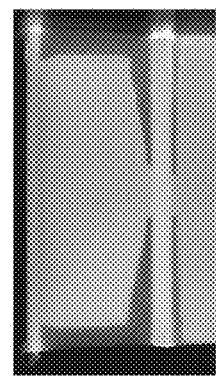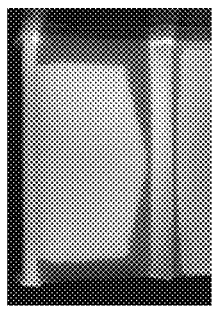

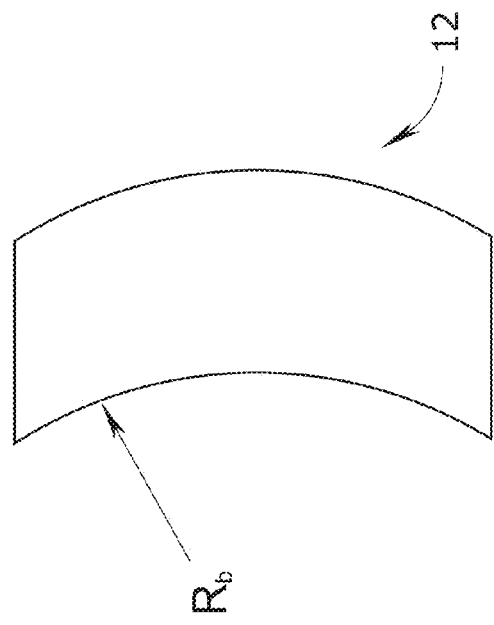
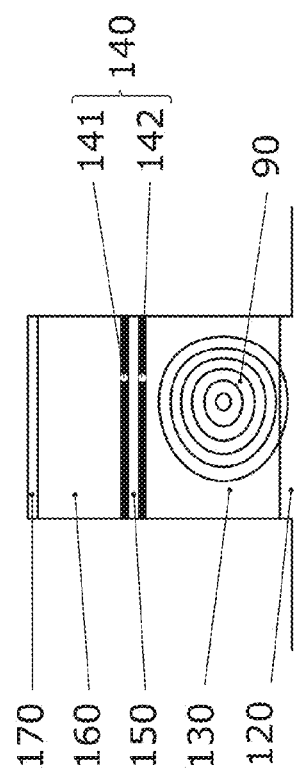
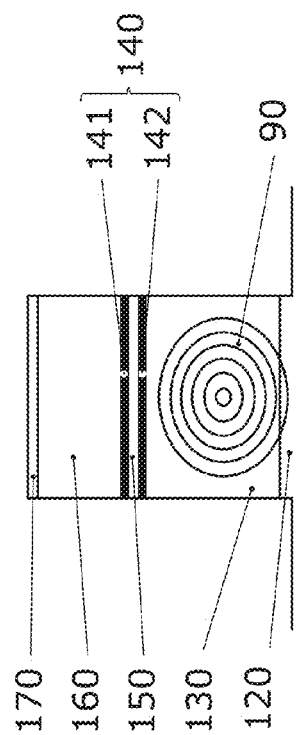

ADIABATIC MODE-PROFILE CONVERSION BY SELECTIVE OXIDATION FOR PHOTONIC INTEGRATED CIRCUIT

REFERENCE TO RELATED APPLICATIONS

This application claims one or more inventions which were disclosed in Provisional Application No. 61/507,233, filed Jul. 13, 2011, entitled "Adiabatic Mode-Profile Conversion by Selective Oxidation For Photonic Integrated Circuit". The benefit under 35 USC §119(e) of the United States provisional application is hereby claimed, and the aforementioned application is hereby incorporated herein by reference.

BACKGROUND OF THE INVENTION

1. Field of the Invention

This invention relates to the field of integrated optics, and more particularly to methods of monolithic integration of active devices with passive components.

2. Description of Related Art

Presently many optoelectronic systems are assembled from separate components that are individually packaged into fiber modules. These components include, but are not limited to, LEDs, lasers, amplifiers, modulators, detectors, power splitters, switchers, filters, and multiplexers. However, the cost of the components is high mainly because of the package itself, where coupling optics, temperature stabilization, and precise adjustment are all required. Moreover, systems based on the discrete components are power consumable and it is difficult to make them compact in size. Joining the components into a single-package configuration, also known as a photonic integration circuit (PIC), eliminates these disadvantages.

Photonic integration circuits can be based either on hybrid or on monolithic integration. Hybrid photonic integrated circuits bring together optical devices based on different material systems, for example, an III-V evanescent laser bonded on Si (A. W. Fang et al., "Electrically pumped hybrid AlGaInAs-silicon evanescent laser", Optical Express, vol. 14, 9203-9210, 2006). An advantage of hybrid integration is that each component is optimized for one specific function, enabling deployment of state of the art components. However, there are also disadvantages including, but not limited to, an inefficient light coupling between the components, different lattice and thermal expansion constants, and diffusion of impurities between the components.

On the other hand, monolithic integration joins the devices based on the same material system, avoids aligning and bonding problems, and provides exceptional thermal and mechanical characteristics (see for example U.S. Pat. No. 7,282,311 by Little, issued Oct. 16, 2006). Taking into account these benefits, monolithic integration can be preferable for certain applications with modest integration levels.

Low-loss optical waveguides are normally needed in PICs for interconnection and also for some passive components, e.g. spectral and spatial filters, splitters, delay lines, and chromatic dispersion compensators. There are a few approaches for monolithic integration of the passive waveguides including different regrowth technologies, quantum well intermixing, and vertical twin-waveguide structure growth.

The most straightforward passive waveguide integration technique is epitaxial growth of a second waveguide with the desired properties after the removal of the original waveguide, also known as the butt joint regrowth method (see U.S. Pat. No. 4,820,655 by Noda, issued Apr. 11, 1989). The main advantage of this integration scheme is a high degree of flexibility in the design, for example, compositions, thicknesses, and doping concentrations. However, the epitaxial crystal growth at the abutting locations creates the problem of layer misalignment and imperfect interfaces (quality and shape) between the active and passive components, which results in scattering loss, parasitic optical feedback, and low coupling efficiency. Another regrowth approach, selective area growth, uses a dielectric mask to inhibit epi-layer growth during metal organic vapor phase epitaxy (MOVPE) or metal organic chemical vapor deposition (MOCVD) and, as a result, to tailor the waveguide properties along its length (see U.S. Pat. No. 5,543,353 by Suzuki, issued Aug. 6, 1996 and U.S. Pat. No. 7,060,615 by Glew, issued Jun. 13, 2006). However, the waveguide properties cannot be strongly changed on a short distance resulting in additional absorption losses and chirp in the region of the band edge transition. Moreover, a very precise control of growth parameters is necessary.

Another passive waveguide integration method is based on disordering of quantum wells, also known as quantum well intermixing (QWI), to locally change band-edges (see U.S. Pat. No. 6,989,286 by Hamilton, issued Jan. 24, 2004). Since the QWI process only slightly modifies the composition profile and does not change the average composition, there is a negligible refractive index discontinuity at the interface between adjacent sections. Different modifications of the QWI technique, such as impurity free vacancy disordering (IFVD), impurity induced disordering (IID) and laser-induced disordering (LID), suffer from their specific drawbacks, including free-carrier absorption, parasitic conductivity, residual damage from implantation, inferior quality of recrystallized material after laser melting, and degradation of the top surface caused by high-temperature annealing. Taking into account complexity, irreproducibility, and the poor area selectivity of the intermixing process, QWI technology is not a practical method for monolithic integration of multi-functional optoelectronic devices in PIC (J. H. Marsh, "Quantum well intermixing", Semiconductor Science Technology, vol. 8, pp. 1136-1155, 1993).

Vertical twin waveguide structure represents a promising integration platform technology. This integration technique can be realized by using either the waveguide modes beating concept or an adiabatic mode transformation concept. In the first case, the power transfer results from the bimodal interference between two supermodes of the vertical twin-waveguide (TG) structure (Y. Suematsu et al., "Integrated twin-guide AlGaAs laser with multiheterostructure", IEEE Journal of Quantum Electronics, vol. 11, pp. 457-460, 1975; see also U.S. Pat. No. 5,859,866 by Forrest, issued Jan. 12, 1999). Despite the fact that active and passive functions are separated into different vertically displaced waveguides, all integrated components cannot be well optimized separately due to a requirement of resonant coupling of both waveguides. Moreover, performance characteristics of the devices based on the TG structures are not stable due to mode interaction and fluctuation in the device structure itself (layer thickness, composition, dry etching profiles). On the contrary, the adiabatic mode transformation concept, based on an asymmetric twin-waveguide (ATG) with tapered couplers, is unaffected by modal interference (see U.S. Pat. No. 6,282,345 by Schimpe, issued Aug. 28, 2001). The waveguide is designed in such a way that only one mode exists. To reduce coupling losses during the power transfer process, the lateral tapering of the active waveguide at a junction of the active-passive waveguides is used (see U.S. Pat. No. 5,078,516 by Kapon, issued Jan. 7, 1992). As the active waveguide rib is narrowed, the mode profile is smoothly transformed without any loss of power and, finally, the mode is adiabatically pushed down into the passive waveguide. This allows the independent optimization of the active/passive devices in a single epitaxial growth step. However, there are strict requirements for the etching process (at least two steps), and for the precision of sub-micron lithography with a complicated alignment procedure. In addition, ridge waveguides are rather long, and precise control of taper tips is required.

Each of the above-mentioned coupling techniques suffers from one or more of the following major drawbacks: high optical/coupling losses, poor manufacturability, high cost, insufficient reproducibility, and inadequate reliability. Therefore, there is a need in the art for a novel economical and manufacturable active-passive coupling technique that permits further progress in photonic-network communication technology.

SUMMARY OF THE INVENTION

Waveguide designs and fabrication methods for adiabatic conversion of waveguide eigen mode provide adiabatic mode-profile conversion in vertical monolithic integration of active devices with passive elements into a single photonic integrated circuit. An advantage of embodiments of the present invention is a simple fabrication procedure which includes single-step etching in combination with subsequent well-controllable selective oxidation. As a result, improved manufacturability and reliability can be achieved.

A tapered single-step ridge waveguide, which includes a multilayer transverse epitaxial structure grown on a substrate, provides an adiabatic mode-profile conversion by a lateral oxidation of Al-rich layers.

The transverse layered structure of the waveguide includes an active region with a plurality of quantum well, quantum dots in a well (DWELL) and/or quantum dot layers for creating an optical gain under current injection, a passive region optimized for low-loss wave propagation, and a mode-control region, including at least one Al-rich layer. A refractive index of the mode-control region can be changed by oxidation, which enables control of an overlapping of an eigen mode with the active region and the passive region, and provides anti-degradation protection of other Al-rich layers. The transverse layered structure also includes at least one cladding region having refractive indexes less than a refractive index of the active region and a refractive index of the passive region. In some preferred embodiments, the refractive index of the active region is higher than the refractive index of the passive region. A material and a thickness of the active region and the passive region are designed to provide mode localization either in the active region or in the passive region.

In the longitudinal direction, the single-step ridge waveguide includes a narrow section, a wide section, and a laterally tapered section that connects the narrow section and the wide section. The narrow section has a width that is sufficiently small such that oxidation of the mode-control region results in the confinement of the eigen mode in the passive region inside the narrow section. The wide section has a width sufficiently large such that an effective refractive index of the wide section is negligibly influenced by oxidation of the mode-control region and therefore the eigen mode is confined in the active region inside the wide section. A change of a width of the lateral taper section provides gradual optical mode power transfer between the active region and the passive region, and the power losses during the mode transfer can be controlled by geometrical parameters of the lateral taper section.

A method of fabricating a tapered ridge waveguide includes the step of epitaxially growing a layered structure on a substrate. The layered structure includes an active region including a plurality of quantum well, quantum dot layers, and/or quantum dots in a well (DWELL) for creating an optical gain under current injection, a passive region optimized for low-loss wave propagation, a mode-control region including at least one Al-rich layer, where an Al composition of this layer is sufficiently high to be transformed to $(AlGa)_xO_y$ by oxidation, and at least one cladding region, the cladding region having refractive indexes less than a refractive index of the active region and a refractive index of the passive region. Each region represents at least one layer with a certain thickness and composition. The composition and thickness of the layers composing the active, the passive, and the mode control regions are designed to provide mode localization either in the active region, if the mode control region is not oxidized, or in the passive region, if the mode control region is oxidized.

The method also includes the step of forming a ridge waveguide in a single etching step. The ridge waveguide includes a narrow section, a wide section, and a laterally tapered section along the ridge. The laterally tapered section connects the narrow section and the wide section.

The method also includes the step of selectively oxidating the mode control region, where an oxidation time and an oxidation temperature are selected such that an oxidation depth is large enough to sufficiently change an effective refractive index of the mode control region in the narrow section in order to provide mode localization in the passive region inside the narrow section. The thickness of the wide section is sufficiently high so that oxidation of the mode-control region in the wide section weakly influences effective refractive index of the wide section and the eigen mode is confined in the active region inside the wide section. A change in the width of the laterally tapered section provides gradual optical mode power transfer between the active region and the passive region, and the power losses during the mode transfer can be controlled by the geometrical parameters of the laterally tapered section.

BRIEF DESCRIPTION OF THE DRAWINGS

FIG. 2a is a perspective view of a first preferred embodiment of the present invention.

FIG. 2b is a longitudinal-section of FIG. 2a along the mode-control region.

FIG. 3a is a vertical cross-section scanning electron microscopy image along line 3a of FIG. 2a.

FIG. 3b shows the optical field distribution of the cross-section shown in FIG. 3a.

FIG. 3c is a vertical cross-section scanning electron microscopy image along line 3c of FIG. 2a.

FIG. 3d shows the optical field distribution of the cross-section shown in FIG. 3c.

FIG. 3e is a vertical cross-section scanning electron microscopy image along line 3e of FIG. 2a.

FIG. 3f shows the optical field distribution of the cross-section shown in FIG. 3e.

FIG. 4a is a plan view of the narrow section of a straight ridge waveguide.

FIG. 4b shows the optical field distribution of the cross-section of the narrow section shown in FIG. 4a.

FIG. 4c is a plan view of the narrow section of a curved ridge waveguide.

FIG. 4d shows the optical field distribution of the cross-section of the narrow section shown in FIG. 4c.

DETAILED DESCRIPTION OF THE INVENTION

In order to overcome the drawbacks of the prior art, the waveguide design and fabrication method are based on the selective oxidation technology for adiabatic mode-profile conversion in the vertical monolithic integration of active devices with passive elements into a single photonic integrated circuit with improved manufacturability and reliability. Some optical devices for which the methods and devices of the present invention could be used include, but are not limited to, lasers, photodetectors, modulators, light emitting diodes, amplifiers, detectors, power splitters, switchers, filters, multiplexers, array waveguide gratings, and passive waveguides.

"Adiabatic", as defined herein, means gradually or smoothly, and with negligible power losses/scattering/interference. "Adiabatic mode transformation", as defined herein, means gradual mode transformation with negligible power losses. A "single-step ridge" and "single-step ridge waveguide", as defined herein, are ridge structures fabricated in a single etching step/process. This process forms a structure with upper surfaces at two heights (a ridge with a single "step"). "Al-rich" layers, as defined herein, are aluminum containing layers with a high aluminum composition ("rich in Al"). In preferred embodiments, "Al-rich" layers are layers with an Al composition that is sufficiently high to be transformed to $(AlGa)_xO_y$ by oxidation. In preferred embodiments, the Al composition in Al-rich layers is greater than or equal to 80%.

The design and method address the problem of vertical monolithic integration of active devices with passive elements. The devices fulfill three general criteria and provide an effective active-passive coupling technique promising for use in monolithically integrated devices such as PIC:

1) control of the refractive index profile of the waveguide and, thus, an overlapping of the eigen mode with the active and passive region by lateral oxidation of Al-rich layers;
2) mode localization either in the active region, or in the passive region depending on the status of the mode-control region (e.g. oxidized or non-oxidized mode-control region); and
3) adiabatic reversible transfer of the eigen mode between the active region and the passive region.

Figure 1C:
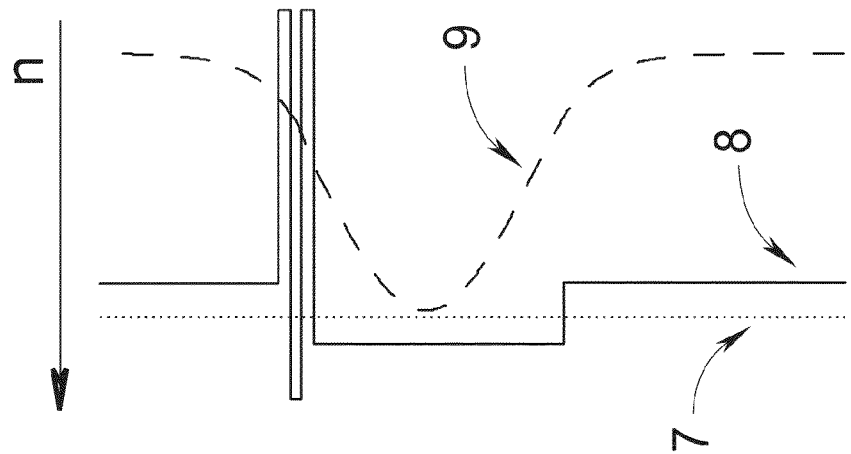
FIG. 1c illustrates the refractive indexes and mode profiles of the waveguide shown in FIG. 1a after oxidation of the mode-control region.
Figure 1B:
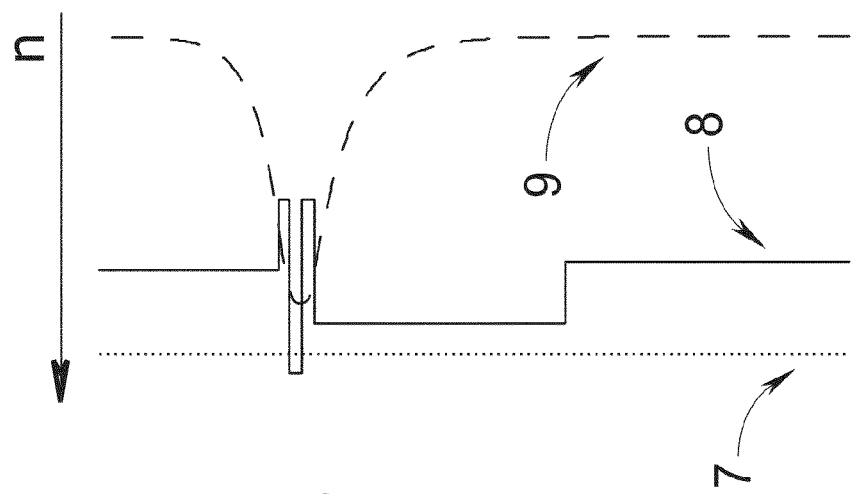
FIG. 1b illustrates the refractive indexes and mode profiles of the waveguide shown in FIG. 1a before oxidation of the mode-control region.
Figure 1A:
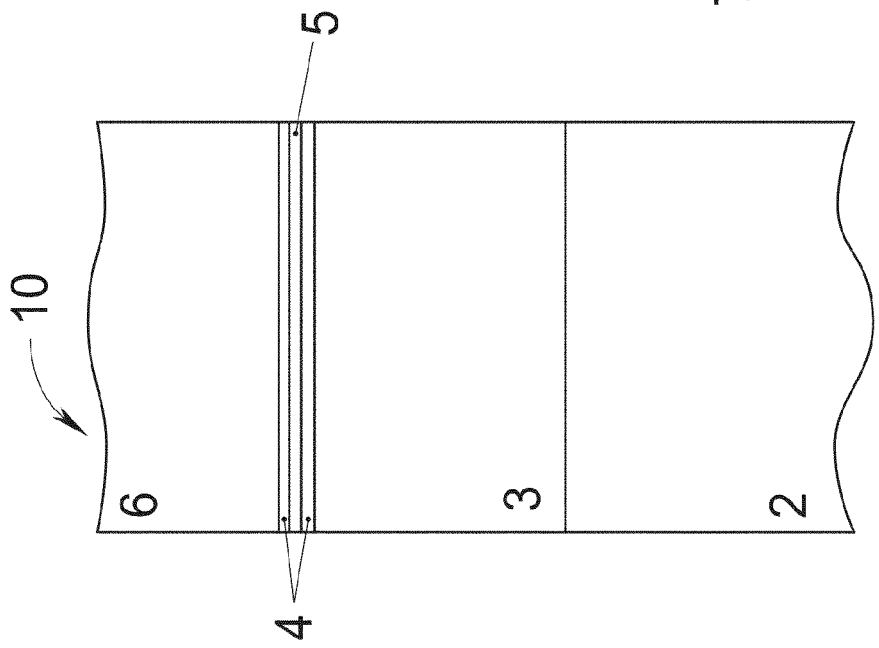
FIG. 1a is a schematic view of a transverse structure of a waveguide of the invention, where the mode-control region is out of the active region.

A waveguide structure is depicted schematically in FIG. 1. The waveguide structure 10, shown in a vertical cross-section in FIG. 1a, includes an active region 5, a passive region 3, a mode-control region 4 and surrounding cladding regions 2 and 6. The mode-control region 4 surrounds the active region 5. In one preferred embodiment, one or more Al-rich layers act as the mode-control region 4. High Al composition is preferable for oxidation (the higher the Al composition the easier (quicker) the oxidation process). In preferred embodiments, the Al composition of the Al-rich layers of the mode-control region 4 is between approximately 80% and 100%. While the mode-control region 4 in this figure surrounds the active region 5, in other embodiments the mode-control region 4 may be inserted into the active region (see, eg., FIG. 7). In other embodiments, the mode-control region 4 is located only above or below the active region.

FIG. 1b and FIG. 1c show the refractive indexes 8 and mode profiles 9 of FIG. 1a in this preferred embodiment, before and after oxidation of the Al-rich layer in the mode-control region 4, respectively. In the case of a non-oxidized mode-control region 4, the optical mode 9 has an effective refractive index 7 higher than the effective refractive index 8 for the passive region 3 and lower than the effective refractive index 8 for the active region 5. The optical mode 9 is thus preferably localized in the active region 5 as illustrated in FIG. 1b. However, the process of wet oxidation transforms the Al-rich layer into an aluminum oxide (e.g.—$(AlGa)_xO_y$) and, hence, causes reduction of the effective refractive index 7 of the mode-control region 4. As a result, the optical mode 9 has an effective refractive index 7 higher than the effective refractive index for the cladding regions 2 and 6 and lower than the effective refractive index for the passive region 3. It is consequently mainly localized in the passive region 3 as shown in FIG. 1c. To achieve such functionality, the refractive index of the active region 5 should be higher than the refractive index of the passive region 3, and the thickness of the passive region 3 should be larger than the thickness of the active region 5. The waveguide 10 can be designed to confine only one eigen mode (fundamental mode) in the active region 5 before lateral oxidation of the mode-control region 4. After the oxidation of the mode-control region 4 the fundamental mode will be confined in the passive region 3.

A preferred embodiment of the present invention is illustrated in a perspective view in FIG. 2a. As shown in FIG. 2a, a tapered ridge waveguide 100 grown on a substrate 110 includes a bottom cladding region 120, a passive region 130, a mode-control region 140, an active region 150, a top cladding region 160 and a cap layer 170. The active region 150, which is grown above the passive region 130, can include a plurality of quantum well, quantum dots in a well (DWELL), and/or quantum dot layers for creating a laser, a photodetector, a modulator, etc., while the passive region 130 is optimized for low-loss wave propagation. In accordance with FIG. 1a, the cladding regions 120 and 160 have refractive indexes less than the refractive index of the active region 150 and the passive region 130. The mode-control region 140 includes two layers, which are preferably Al-rich layers with an Al composition sufficiently high for oxidation. One of the layers 142 is placed below the active region 150 and the other layer 141 is placed above the active region 150. The tapered ridge waveguide 100 is designed as a single-mode and single-step ridge waveguide including a wide section 101 and a narrow section 103 as well as a laterally tapered section 102 between them. The ridge is etched through the active region 150 at least down to the bottom cladding layer 120 to minimize electric device capacity and minimize optical losses at bending of the waveguide, which is critical for many devices including, but not limited to, array waveguide gratings and ring channel filters. To simplify the fabrication process for the device (one etching step and one oxidation process), the Al-rich structures of the mode-control region 140 are preferably uniformly oxidized at a certain length $L_{ox}$ (oxidation depth), which results in formation of a Y-branch like oxidation profile as shown in FIG. 2b. During the oxidation process, Al-rich layers 141 and 142 partly transform into aluminum oxide layers. The oxidation starts at the perimeter and then goes deeper into the structure. The longer the oxidation time, the greater the oxidation depth $L_{ox}$. Section 103 is narrow and layers 141 and 142 are fully oxidized inside this section. Section 101 is wider and layers 141 and 142 are only partly oxidized inside this section (namely to the depth $L_{ox}$ from both sides, marked in black). In the middle part of section 101, layers 141 and 142 are still not oxidized (marked in white). Note that FIG. 2b is a section of FIG. 2a made parallel to layer 141 or layer 142. The effective refractive index of the tapered ridge waveguide is controlled by proper selection of the waveguide widths $D_w$ (the largest width of wide section 101) and $D_n$ (the width of the narrow section 103) and the oxidation depth $L_{ox}$ to provide localization of the eigen mode 90 (see FIGS. 3 and 4) in the passive region 130 for the narrow section 103 (referred to as the oxidized mode-control region) and to provide localization of the eigen mode 90 in the active region 150 for the wide section 101 (referred to as the non-oxidized mode-control region). In other words, the width of the narrow section is preferably sufficiently small such that oxidation of the mode-control region results in the confinement of the eigen mode in the passive region inside the narrow section and a width of the wide section is sufficiently large such that an effective refractive index of the wide section is negligibly influenced by oxidation of the mode-control region and therefore the eigen mode is confined in the active region inside the wide section. The width of the wide section should not be too large in order to avoid very deep oxidation and large electrical capacitance. The width of the narrow section should not be too small in order to avoid a considerable overlap of the optical mode with the active region and bottom cladding layer, which would cause additional internal and bending loss. In preferred embodiments, the width of the wide section ranges from approximately 0.5 µm to approximately 5 µm and the width of the narrow section ranges from approximately 0.3 µm to approximately 3 µm. Mode 9 shown in FIG. 1 is the same mode (in a one-dimensional profile) as mode 90 shown in FIG. 3 (in a two-dimensional profile).

Vertical cross-sections of the tapered ridge waveguide 100 of FIG. 2 are shown in FIGS. 3a, 3c, and 3e taken along section surfaces 3a, 3c, and 3e, respectively, as indicated in FIG. 2a. Corresponding optical field distributions are shown in FIGS. 3b, 3d, and 3f, respectively. Referring to FIG. 3b, the effective refractive index of the tapered ridge waveguide 100 in the wide section 101 is negligibly influenced by a finite oxidation depth $L_{ox}$. Therefore, the eigen mode 90 has an effective refractive index higher than an effective refractive index for the passive region 130 and lower than an effective refractive index for the active region 150, and, thus, the optical mode 90 is propagating primarily in the active region 150.

When the optical mode 90 starts propagating through the laterally tapered section 102, the width of the tapered ridge waveguide 100 is continuously reduced from $D_w$ to $D_n$, hence the effective refractive index of this waveguide is monotonically decreased and the mode profile is smoothly transformed. As a result, the optical power of the eigen mode is gradually transferred from the active region 150 into the passive region 130 as shown in FIG. 3d. When this reduction in the width of the waveguide of FIG. 2 takes place over a sufficiently long distance $L_t$, then the optical mode 90 is adiabatic with negligible power losses displaced into the passive region 130 (downward in FIG. 3). The longer the distance $L_t$, the smaller the losses. According to calculations for $L_t$=80 µm, the losses are less than 8%, and for $L_t$=160 µm, the losses are less than 1%. In a preferred embodiment of the tapered ridge waveguide 100, a length of $L_t$ for the laterally tapered section 102 is more than 350 µm to keep transformation losses below 0.01%. Finally, according to FIG. 3f, the complete oxidized mode-control region noticeably reduces the effective refractive index of the waveguide of FIG. 2 in the narrow section 103. As a result, the effective refractive index of the optical mode 90 becomes higher than the refractive indexes of the cladding regions 120 and 160 and lower than the refractive index of the passive region 130 and, as a result, the optical mode 90 mainly propagates in the passive region 130.

TABLE 1

Layer structure of a tapered ridge waveguide with refractive indices according to the first embodiment of FIG. 2.

| Layer Description | Composition | Layer Thickness (nm) | Refractive index |
| --- | --- | --- | --- |
| Substrate 110 | GaAs | — | 3.45 |
| Bottom cladding region 120 | $Al_{0.81}Ga_{0.19}As$ | 2000 | 3.03 |
| Passive region 130 | $Al_{0.72}Ga_{0.28}As$ | 1600 | 3.08 |
| Mode control region: bottom layer 142 | $Al_{0.9}Ga_{0.1}As/(AlGa)_xO_y$ | 60 | 2.92/1.6 |
| Active region 150 | GaAs | 150 | 3.45 |
| Mode control region: top layer 141 | $Al_{0.9}Ga_{0.1}As/(AlGa)_xO_y$ | 60 | 2.92/1.6 |
| Top cladding region 160 | $Al_{0.81}Ga_{0.19}As$ | 1000 | 3.03 |
| Cap layer 170 | GaAs | 100 | 3.45 |

In one example of a tapered waveguide 100, the epitaxial wafer of the tapered ridge waveguide 100 is grown in a single epitaxial process on a substrate 110 of GaAs by molecular beam epitaxy (MBE) or metal organic chemical vapor deposition (MOCVD). The compositions of the layers of this waveguide 100 are summarized in Table 1. In this example of the waveguide shown in FIG. 2, the active region 150 is a 150 nm-thick GaAs layer, while the low-loss passive region 130 is a 1600 nm-thick AlGaAs (72%) layer. The top cladding region 160 of the tapered ridge waveguide is composed of a 1000 nm-thick AlGaAs (81%) layer overgrown with a cap layer 170 of 100 nm-thick GaAs, while the bottom cladding region 120 is a 2000 nm-thick AlGaAs (81%) layer. The mode control region 140 is composed of two 60 nm-thick AlGaAs (90%) layers. One layer 141 is placed between interfaces of the top cladding region 160 and the active region 150 (e.g. above the active region 150), and the other layer 142 is placed between interfaces of the active region 150 and the passive region 130 (e.g. below the active region 150). In this example, the tapered ridge waveguide 100 is designed for an operating wavelength of 1.3 µm. The single mode tapered ridge waveguide 100 is fabricated by optical lithography and reactive ion etching. The device has a stripe width $D_w$ of 3 µm in the wide section 101 and a stripe width $D_n$ of 1.6 µm in the narrow section 103. The etching depth, $D_e$, of the epitaxial structure is more than 3.1 µm. Note that a stop-etching layer can be introduced into the bottom cladding layer to provide high accuracy of the deep etching process. In this example of the waveguide, the laterally tapered section 102 has a linear profile with a taper length $L_t$ of 360 µm. A wet lateral selective oxidation technique is used to fabricate buried dielectric (AlGa)$_x$O$_y$ layers with a low refractive index. The oxidation depth L$_{ox}$ of the Al-rich layers 141 and 142 is around 0.9 μm. FIGS. 3a, 3c, and 3e also depict the cross-sectional scanning electron microscopy images of the fabricated tapered ridge waveguide 100 along section surfaces 3a, 3c, and 3e, respectively. Note that the abundant amount of oxidant into the (AlGa)$_x$O$_y$ layer 141 with the subsequent vertical oxidation of the AlGaAs (81%) layer 160 results in the taper oxidation front of the mode control region 140. Regarding theoretical simulation, such a complex oxidation front can result only in weak additional confinement of the optical mode and does not cause any noticeable changes in performance of the tapered ridge waveguide 100.

Figure 5A:
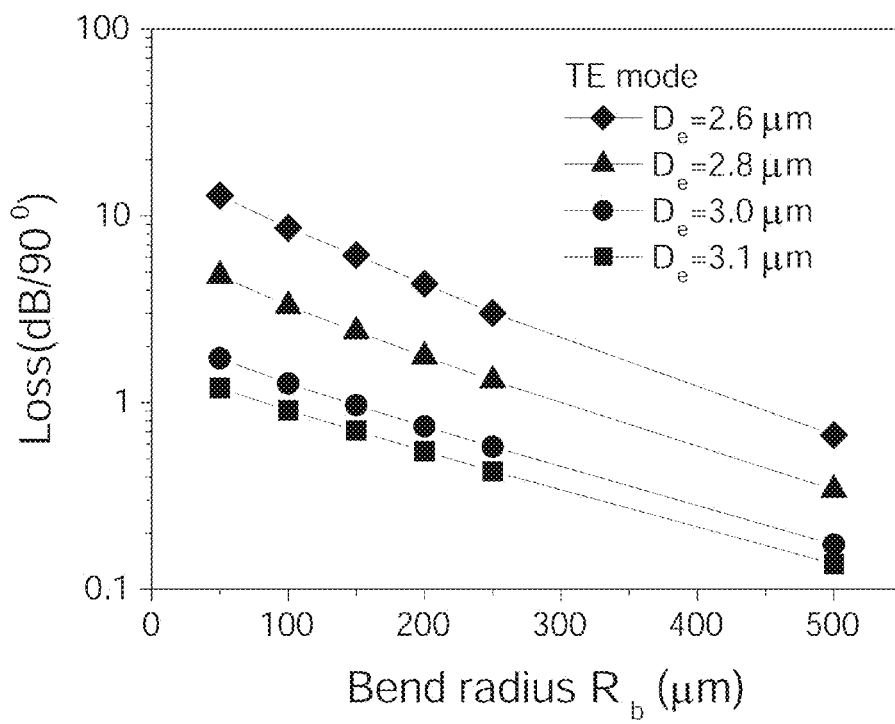
FIG. 5a shows the bending losses in dB for a 90° bend as a function of curvature radius $R_b$ for a curved ridge waveguide according to FIG. 4c for the different etching depth $D_e$ at TE-polarization of optical mode.

An important component of the modern PIC systems are curved optical channel waveguides; therefore, the issue of the excess losses due to bending is actual and important for the present invention. FIG. 4a shows a straight ridge waveguide 11, where the field of the optical mode 90 is symmetric about the field peak and occurs at the center of the passive region 130 of the waveguide 11, as shown in FIG. 4b. In contrast, in a curved waveguide 12, the field mode profile is asymmetric, as the optical mode 90 shifts toward the outward side of the bend curvature (see FIGS. 4c and 4d). This trend gets more pronounced with a smaller bend radius R$_b$ and the optical mode 90 becomes leaky. Hence, the continuous radiation of mode power tangentially out of the curved waveguide 12 as light travels around the bend causes additional optical losses. Thus, the bending losses dramatically increase with a decrease in the curvature radius R$_b$, as shown in FIG. 5a. Such excess loss can be reduced by increasing the confinement of the mode field 90. Indeed, if the mode 90 will be weakly confined in the passive region 130, then the optical mode 90 will tend to have long exponential tails extending into the cladding region 120, e.g. the optical mode 90 will suffer from stronger radiation. In contrast, the increased degree of modal confinement caused by the deep etching of the waveguide (etching depth at least down to the bottom cladding region 120, D$_e$>3 μm) will result in a decrease in the bending losses (see FIG. 5a). The wider the waveguide, the higher the effective refractive index, the stronger confinement of the optical mode, and, therefore, the lower the bending losses. On the contrary, the thinner the waveguide, the lower the effective refractive index, the weaker confinement of the optical mode, and the stronger power scattering on waveguide sidewalls. Moreover the higher-order modes tend to have more energy in the exponential tail outside of the passive region 130, causing larger bending losses, which can be used for effective selection of the fundamental mode in the case of multimode waveguides.

Figure 5B:
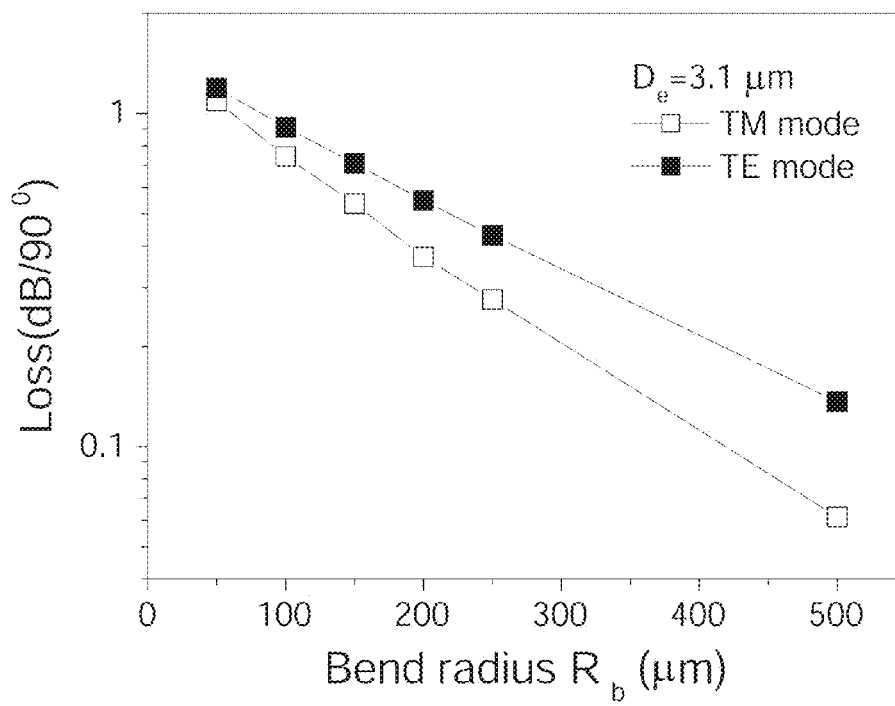
FIG. 5b shows the bending losses in dB for a 90° bend as a function of curvature radius $R_b$ for a curved ridge waveguide according to FIG. 4c for the TE and TM polarization of optical mode at fixed etching depth of $D_e$=3.1 µm.

Another important aspect is the influence of polarization on bending losses. Referring to FIG. 5b, proper design optimization of the waveguide 10 and increasing the confinement of the mode field enable one to keep a relatively low level of bending losses for both TM (transverse magnetic) polarization and TE (transverse electric) polarization even for small bend radiuses R$_b$<100 μm. In preferred embodiments, an effective refractive index of the waveguide for TE polarization is close to an effective refractive index for TM polarization, which can be important for polarization-independent photonic integrated circuits. In a preferred embodiment, a difference between an effective refractive index for transverse electric polarization and an effective refractive index for transverse magnetic polarization is less than $10^{-3}$. In summary, in preferred embodiments, the waveguide 10 should be designed as a single-mode waveguide with a deep ridge to minimize optical losses at bending, where negligible polarization sensitivity is also possible by proper selection of the waveguide width and the passive region thickness.

Figure 6:
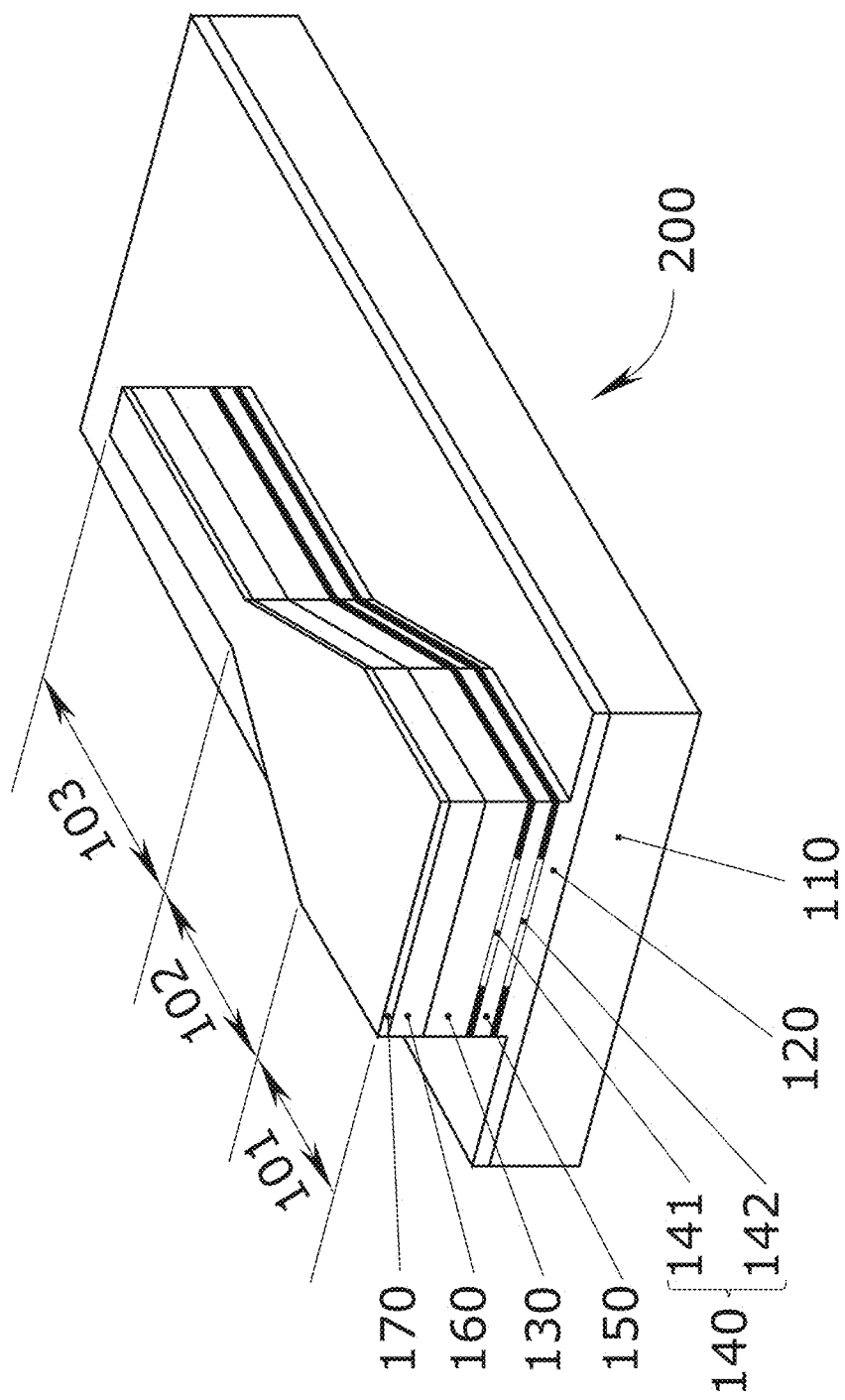
FIG. 6 is a perspective view of a second embodiment of the present invention.

FIG. 6 schematically illustrates a tapered ridge waveguide 200 in another embodiment of the present invention. A difference between the tapered ridge waveguide 100 and the tapered ridge waveguide 200 is that, in FIG. 6, the passive region 130 is grown above the active region 150. According to the general concept, the ridge waveguide 200 is designed to confine the eigen mode in the active region 150 in the wide section 101. The continuous reduction of stripe width of the waveguide of FIG. 6 (laterally tapered section 102) results in adiabatic displacement of the optical mode 90 from the active region 150 into the passive region 130 (upward as compared to FIG. 3). Finally, the optical mode is confined in the passive region 130 in the narrow section 103.

Figure 7:
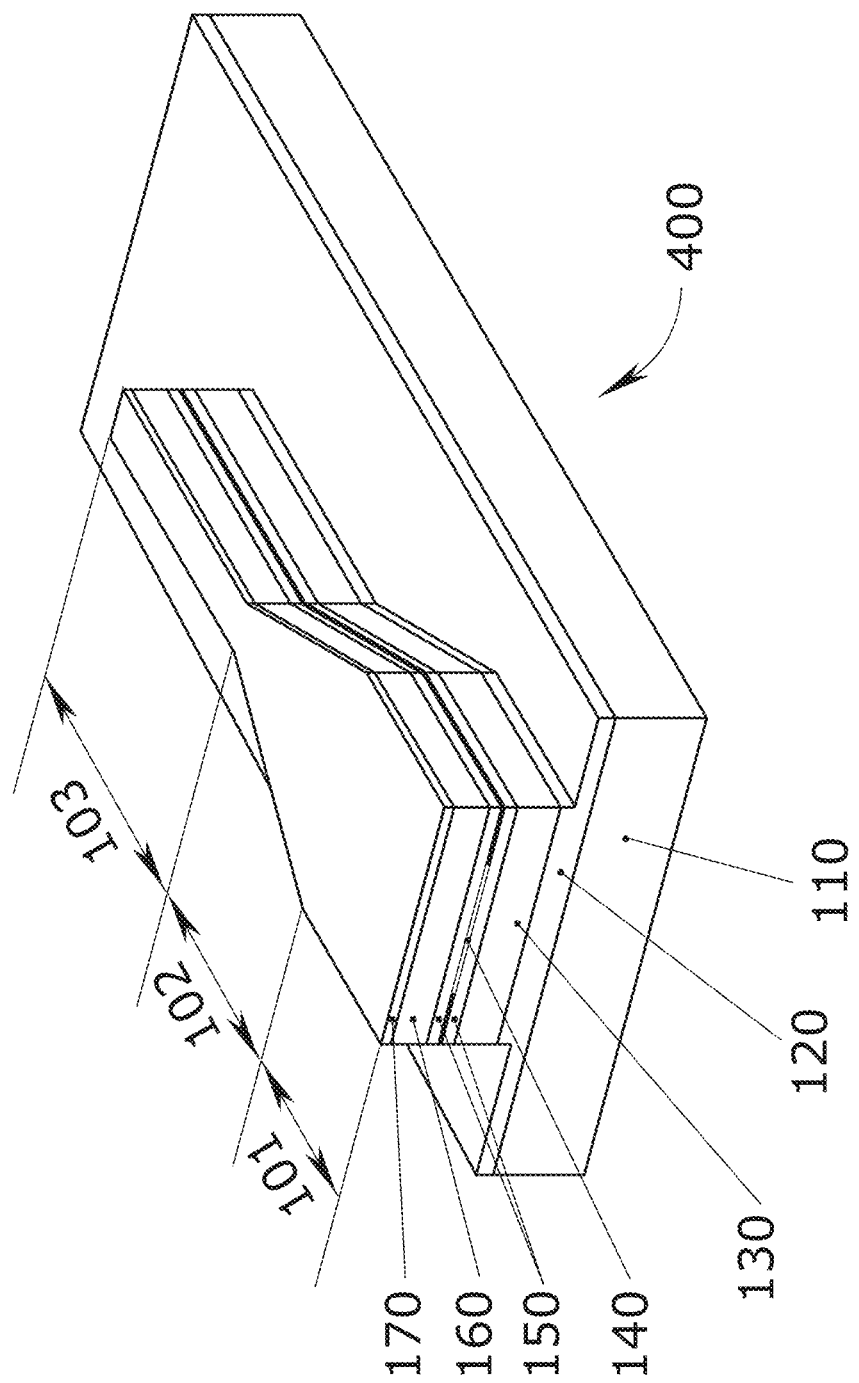
FIG. 7 is a perspective view of a third embodiment of the present invention.

In another embodiment shown in FIG. 7, a design of a tapered ridge waveguide 400 is similar to that for the tapered ridge waveguide 100 except for the mode-control region 140. The mode-control region 140 is inserted into the active region 150 and includes at least one Al-rich layer in this embodiment. The tapered ridge waveguide 400 is designed to localize the eigen mode in the active region 150 in the wide section 101. The lateral tapering in the taper section 102 provides adiabatic transfer of optical power from the active region 150 into the passive region 130 (downward as compared to FIG. 3). Finally, the optical mode is confined in the passive region 130 in the narrow section 103.

Although the laterally tapered section 102 has a linear profile for all embodiments illustrated herein, this is not intended to limit the invention to the precise embodiments disclosed herein.

The linear taper should be designed to be large enough for adiabatic transfer of the eigen mode between the active region and the passive region. Note that tapers of other forms and profiles may be used within the spirit of the present invention. For example, a lateral taper with an exponential profile has smaller mode transformation losses than a linear taper and provides the adiabatic displacement of the eigen mode between the active region 150 and the passive region 130 at smaller taper lengths L$_t$. Similarly, with a non-exponential curved profile, the taper has a smaller mode transformation loss and provides the adiabatic transfer of the eigen mode between the active region and the passive region at a smaller length of the taper than with a linear profile. As another example, a two-section taper has a first section with a linear profile and a second section with an exponential profile. This two-section taper provides a trade-off between a linear profile taper and an exponential profile taper. For example, the first section of this taper results in preliminary lateral mode confinement, while the second section provides the adiabatic power transfer between the active region 150 and the passive region 130 at smaller total taper lengths L$_t$.

The devices address the issue of vertical monolithic integration of active devices with passive elements into a single photonic integrated circuit, therefore the design rules of doping in optoelectronic devices is actual. Depending on the exact application (light emitting diodes, lasers, modulators, passive waveguides, etc.), various doping profiles of a waveguide structure of the present invention to realize electrical conductivity, p-n-junction(s) or highly doped contact layers are possible. For example, the doping profile of the devices based on the first embodiment can be a p$^+$-type doped cap layer (acting as contact layer) 170, a p-type doped top cladding region 160, an undoped active region 150, a lightly n-type doped passive region 130, and an n-type doped bottom cladding region 120 on an n$^+$-type substrate 110. Note that a reverse doping profile for a p$^+$-type substrate 110 is also possible, however the passive region 130 should be preferably doped by n-type material to provide the lowest optical losses during propagation of the optical mode 90 in the passive region 130.

The so-called wet lateral selective oxidation of Al-rich layers technology has a unique feature in that it provides the opportunity to form buried insulating layers with a high structural quality and with the required electrical and optical parameters. Moreover, this technique enables smoothing of the sub-micron surface roughness of the ridge waveguide, which is especially important for adiabatic low-loss transfer of the optical power. The present invention also addresses possible solutions to some critical problems related to the oxidation technique.

In fact, the accumulated stress and the amount of the intermediate products generated in the oxidation reaction result in poor mechanical stability of the oxidized structures. In addition, the residual hydro-oxides are metastable, which can result in the undesirable oxidation reaction in the future. Using in-situ high-temperature annealing allows not only the effectively removal of the intermediate products, but also the partial conversion of the amorphous oxide into the more stable polycrystalline phase. Furthermore, the use of AlGaAs layers with relatively high Ga-composition also provides improved mechanical stability compared to pure AlAs layers.

Another critical issue is reproducibility and uniformity for oxidation across the epitaxial structure due to the extremely sensitive compositional, temperature, and doping (level and type) dependencies of the oxidation rates, especially in the Al-concentration range of 96-100%. However, the activation energy for the oxidation reaction of an Al-rich layer demonstrates weak composition dependency at an Al-composition less than 92% and, thus, the oxidation rate is insensitive to small deviations of Al. In combination with diffusion-limited regimes of oxidation, where the oxidation process is determined by the diffusion of water vapor through the oxide to the reaction front rather than reaction rate, the relatively high degree of oxidation selectivity between AlGaAs layers provides reproducible oxidation. An additional improvement of oxidation reproducibility can be provided by the short-time chemical etching before the oxidation process (for example $NH_4OH:H_2O_2:H_2O$ solution) to remove the surface damage and contamination caused by the non-chemical etching, for example of reactive ion etching and dry etching.

All of the references mentioned herein are hereby incorporated herein by reference.

Accordingly, it is to be understood that the embodiments of the invention herein described are merely illustrative of the application of the principles of the invention. Reference herein to details of the illustrated embodiments is not intended to limit the scope of the claims, which themselves recite those features regarded as essential to the invention.

What is claimed is:

1. A tapered ridge waveguide formed in a semiconductor layered structure providing an adiabatic mode-profile conversion by a lateral oxidation of Al-rich layers, wherein:
   a) the semiconductor layered structure is grown in a single epitaxial process on a substrate, and comprises:
      i) an active region comprising layers selected from the group consisting of: a plurality of quantum wells, a plurality of quantum dot layers, a plurality of quantum dots in a well, and any combination of a plurality of quantum wells, a plurality of quantum dot layers and a plurality of quantum dots in a well, for light generation or to control a spectrum, power, or phase of propagating light by injected carriers, temperature or an electrical field;
      ii) a passive region optimized for low-loss light wave propagation;
      iii) a mode-control region, including at least one Al-rich layer, wherein a refractive index of the mode-control region can be changed by oxidation, which enables control of an overlapping of an eigen mode with the active region and the passive region; and
      iv) at least one cladding region, the cladding region having refractive indexes less than a refractive index of the active region and a refractive index of the passive region;
      wherein a material and a thickness of the active region and the passive region are designed to provide mode localization either in the active region or in the passive region; and
   b) the tapered ridge waveguide comprises a longitudinal single-step ridge waveguide comprising a plurality of the layers in the semiconductor layered structure and:
      i) a narrow section, wherein a width of the narrow section is selected such that oxidation of the mode-control region results in the confinement of the eigen mode in the passive region inside the narrow section;
      ii) a wide section, wherein a width of the wide section is selected such that an effective refractive index of the wide section is negligibly influenced by oxidation of the mode-control region and therefore the eigen mode is confined in the active region inside the wide section; and
      iii) a laterally tapered section connecting the narrow section and the wide section, wherein a change of a width of the laterally tapered section provides gradual optical mode power transfer between the active region and the passive region.

2. The waveguide of claim 1, wherein the ridge is etched at least down to a bottom cladding layer to minimize optical losses at a bending of the waveguide.

3. The waveguide of claim 1, wherein the mode-control region comprises a step-grading Al-rich multilayer structure.

4. The waveguide of claim 1, wherein the mode-control region is located within the active region such that complete oxidation of the mode-control region results in displacement of the eigen mode from the active region to the passive region.

5. The waveguide of claim 4, wherein the passive region is located below the active region and the cladding region comprises at least one bottom cladding layer located between the passive region and the substrate and at least one top cladding layer located above the active region.

6. The waveguide of claim 5, further comprising a cap layer located above the top cladding layer.

7. The waveguide of claim 1, wherein the mode-control region comprises at least one layer placed below the active region and at least one layer placed above the active region, such that complete oxidation of the mode-control region result in displacement of the eigen mode from the active region to the passive region.

8. The waveguide of claim 7, wherein the passive region is located below the mode-control region and the cladding region comprises at least one bottom cladding layer located between the passive region and the substrate and at least one top cladding layer located above the mode-control region.

9. The waveguide of claim 8, further comprising a cap layer located above the top cladding layer.

10. The waveguide of claim 1, wherein the waveguide parameters are optimized for keeping only a fundamental waveguide mode.

11. The waveguide of claim 1, wherein the laterally tapered section has a profile selected from the group consisting of:

a) a linear profile wherein a length of the taper is large enough for adiabatic transfer of the eigen mode between the active region and the passive region;
b) an exponential profile wherein the taper has a smaller mode transformation loss than with the linear profile and provides the adiabatic transfer of the eigen mode between the active region and the passive region at a smaller length of the taper than in the linear profile;
c) a non-exponential curved profile, wherein the taper has a smaller mode transformation loss than with the linear profile and provides the adiabatic transfer of the eigen mode between the active region and the passive region at a smaller length of the taper than in the linear profile; and
d) a multi-section profile comprising any combinations of a), b), and c).

12. The waveguide of claim 1, further comprising a doping profile that enables a realization of electrical conductivity, p-n-junction(s) and highly doped contact layers.

13. The waveguide of claim 12, wherein the passive region is doped by an n-type material to reduce power losses.

14. The waveguide of claim 1, wherein a difference between an effective refractive index for transverse electric polarization and an effective refractive index for transverse magnetic polarization is less than $10^{-3}$.

15. The waveguide of claim 1, wherein the cladding region further comprises a stop-etching layer introduced into a bottom cladding layer.

16. The waveguide of claim 1, wherein a thickness of the passive region is thicker than a thickness of the active region.

17. The waveguide of claim 1, wherein the width of the wide section ranges from approximately 0.5 µm to approximately 5 µm and the width of the narrow section ranges from approximately 0.3 µm to approximately 3 µm.

18. The waveguide of claim 1, wherein the at least one Al-rich layer comprises at least 80% aluminum.

19. A method of fabricating a tapered ridge waveguide for adiabatic low-loss mode-profile conversion based on oxidation technology, wherein the fabrication process comprises the following steps:
a) epitaxially growing a layered structure on a substrate in a single epitaxial process, wherein the structure includes the following regions, wherein each region represents at least one layer with a certain thickness and composition:
i) an active region comprising a plurality of layers selected from the group consisting of: a plurality of quantum wells, a plurality of quantum dot layers, a plurality of quantum dots in a well, and any combination of a plurality of quantum wells, a plurality of quantum dot layers and a plurality of quantum dots in a well, for light generation or to control a spectrum, power, or phase of propagating light by injected carriers, temperature or an electrical field;
ii) a passive region optimized for low-loss light wave propagation;
iii) a mode-control region including at least one Al-rich layer, wherein an Al composition of the Al-rich layer is sufficiently high to be transformed to $(AlGa)_xO_y$ by oxidation; and
iv) at least one cladding region, the cladding region having refractive indexes less than a refractive index of the active region and a refractive index of the passive region;
wherein the composition and thickness of the layers composing the active, the passive, and the mode control regions, are designed to provide mode localization either in the active region if the mode control region is not oxidixed or in the passive region if the mode control region is oxidixed;
b) forming a ridge waveguide in a single etching step, wherein the waveguide comprises the following sections along the ridge: a narrow section, a wide section, and a laterally tapered section, wherein the laterally tapered section connects the narrow section and the wide section; and
c) selectively oxidizing the mode control region, wherein an oxidation time and an oxidation temperature are selected such that an oxidation depth changes an effective refractive index of the mode control region in the narrow section in order to provide mode localization in the passive region inside the narrow section;
wherein a thickness of the wide section is selected such that oxidation of the mode-control region in the wide section weakly influences effective refractive index of the wide section and the eigen mode is confined in the active region inside the wide section; and
wherein a change in the width of the laterally tapered section provides gradual optical mode power transfer between the active region and the passive region, and wherein the power losses during the mode transfer can be controlled by the geometrical parameters of the laterally tapered section.

20. The method of claim 19, wherein the width of the wide section ranges from approximately 0.5 µm to approximately 5 µm and the width of the narrow section ranges from approximately 0.3 µm to approximately 3 µm.

21. The method of claim 19, wherein the at least one Al-rich layer comprises at least 80% aluminum.

* * * * *